United States Patent
Kim et al.

(10) Patent No.: US 7,476,868 B2
(45) Date of Patent: Jan. 13, 2009

(54) APPARATUS AND METHOD FOR GENERATING IONS OF AN ION IMPLANTER

(75) Inventors: Seong Gu Kim, Pyeongtaek-si (KR); Jai Kwang Shin, Anyang-si (KR); Jae Joon Oh, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 112 days.

(21) Appl. No.: 11/453,075

(22) Filed: Jun. 15, 2006

(65) Prior Publication Data

US 2007/0152165 A1 Jul. 5, 2007

(30) Foreign Application Priority Data

Dec. 30, 2005 (KR) .................. 10-2005-0135135

(51) Int. Cl.
*H01J 37/08* (2006.01)
*H01J 37/30* (2006.01)

(52) U.S. Cl. .............. 250/423 R; 250/492.21; 250/492.3; 315/111.31; 315/111.81

(58) Field of Classification Search ............ 250/423 R, 250/426, 424, 492.1, 492.2, 492.21, 492.3; 315/111.31, 111.21, 111.41, 111.81, 111.91

See application file for complete search history.

(56) References Cited

U.S. PATENT DOCUMENTS

| | | | | |
|---|---|---|---|---|
| 2,606,291 | A | * 8/1952 | Wilson | ............ 250/292 |
| 2,697,788 | A | * 12/1954 | Wilson | ............ 250/425 |
| 5,393,984 | A | * 2/1995 | Glavish | ............ 250/396 ML |
| 5,481,116 | A | * 1/1996 | Glavish et al. | ........ 250/396 ML |
| 5,821,677 | A | 10/1998 | Benveniste | |
| 6,167,169 | A | * 12/2000 | Brinkman et al. | ............... 385/4 |
| 6,184,532 | B1 | * 2/2001 | Dudnikov et al. | ....... 250/423 R |
| 6,335,535 | B1 | * 1/2002 | Miyake et al. | ......... 250/492.21 |
| 6,740,393 | B1 | * 5/2004 | Massler et al. | ............ 428/216 |
| 6,815,697 | B2 | * 11/2004 | Sano et al. | ............. 250/492.21 |

(Continued)

FOREIGN PATENT DOCUMENTS

JP 09-055170 2/1997

(Continued)

OTHER PUBLICATIONS

U.S. Appl. No. 11/594,939, filed Nov. 9, 2006, Keum et al., Samsung Electronics Co., Ltd.

(Continued)

*Primary Examiner*—Bernard E Souw
(74) *Attorney, Agent, or Firm*—Staas & Halsey LLP

(57) ABSTRACT

An ion generator of an ion implanter, the ion generator includes: an arc chamber provided with a slit for ion extraction and forming an equipotential surface with a first voltage; a filament installed inside of the arc chamber, heated to a predetermined temperature and generating electrons; magnetic field devices provided outside of the arc chamber and supplied with a current from a current source and generating a magnetic field in the arc chamber; a gas discharge device injecting a predetermined gas into the arc chamber; and an electrode positioned opposite to the slit and supplied with a second voltage having a high voltage than the first voltage from a voltage source and generating a magnetic field in the arc chamber.

9 Claims, 7 Drawing Sheets

U.S. PATENT DOCUMENTS

| | | | |
|---|---|---|---|
| 7,160,616 B2 * | 1/2007 | Massler et al. | 428/408 |
| 7,351,987 B2 * | 4/2008 | Kabasawa et al. | 250/492.21 |
| 2007/0075266 A1 * | 4/2007 | Yun et al. | 250/423 R |
| 2007/0114436 A1 * | 5/2007 | Keum et al. | 250/423 F |
| 2007/0152165 A1 * | 7/2007 | Kim et al. | 250/423 R |

FOREIGN PATENT DOCUMENTS

| | | |
|---|---|---|
| JP | 09-063981 | 3/1997 |
| JP | 10-172448 | 6/1998 |
| JP | 2001-160368 | 6/2001 |
| KR | 10-2000-0020760 | 9/1998 |
| KR | 20-1999-0036734 | 9/1999 |
| KR | 10-0350613 | 8/2002 |
| KR | 1020020091371 | 12/2002 |
| KR | 10-2004-0070754 | 8/2004 |
| KR | 10-2005-0030007 | 3/2005 |
| KR | 1020050058755 | 6/2005 |

OTHER PUBLICATIONS

U.S. Appl. No. 11/521,534, filed Sep. 15, 2006, Yun et al., Samsung Electronics Co., Ltd.

* cited by examiner

APPARATUS AND METHOD FOR GENERATING IONS OF AN ION IMPLANTER

CROSS-REFERENCE TO RELATED APPLICATIONS

This application claims the benefit of Korean Patent Application No. 10-2005-0135135, filed on Dec. 30, 2005, in the Korean Intellectual Property Office, the disclosure of which is incorporated herein by reference.

BACKGROUND OF THE INVENTION

1. Field of the Invention

The present invention relates to an ion generator of an ion implanter, and more particularly, to an ion generator of an ion implanter which can generate an electric field in an arc chamber of the ion generator, thereby improving an ion extraction rate from the arc chamber.

2. Description of the Related Art

In a semiconductor manufacturing process, an ion implanter is utilized in an ion implantation process so that a wafer has an electrical property by implanting impurities in the wafer. Namely, an ion implanter is one of a number of semiconductor manufacturing apparatuses (equipment) for an ion implantation process. Also, the ion implantation process is a basic process for implanting impurities in a wafer. A principal of an ion implanting technology is to physically fill in a wafer by applying a high energy beam of ions to the wafer. In this instance, a method of implanting ions of boron (B), phosphorus (P), arsenic (As), antimony (Sb), etc., which is group 3 or group 5 of the periodic table, in silicon, which is group 4 of the periodic table, is generally utilized.

FIG. 1 is a diagram illustrating a configuration of an ion implanter according to the conventional art (prior art).

As illustrated in FIG. 1, the ion implanter 100 may include an ion generator 110, an acceleration electrode 120, an electromagnet 130, and an ion beam shape correction electrode 140. In this instance, the ion generator 110 generates predetermined ions and extracts the generated ions via the acceleration electrode 120 accelerating the ions. Also, the electromagnet 130 selects only necessary ions from the accelerated ions and transmits the selected ions to the ion beam shape correction electrode 140. The ion beam shape correction electrode 140 corrects an ion beam shape of the selected ions and implants the same in a wafer 150, which may be on a base 160. As the ions are implanted in the wafer 150, the wafer 150 gains an electrical property.

FIG. 2 is a diagram illustrating a configuration of an ion generator of an ion implanter according to a conventional art.

As illustrated in FIG. 2, the ion generator may include an arc chamber 210 and an extraction electrode 220. The arc chamber 210 may include a filament 211, a gas discharge device 212, a slit 213 and a repeller 215.

When the filament 211 is heated to a predetermined temperature, the filament 211 generates electrons. When a voltage $V_f$ is supplied to the arc chamber 210 and the filament 211, the generated electrons are then accelerated to obtain an energy necessary for generating ions. In this instance, the generated electrons may disappear into a wall surface of the arc-chamber 210 because of an electrical property generated inside of the arc chamber 210. Also, the electrons accelerated towards the repeller 215 may be re-accelerated to the inside of the arc chamber 210 by a repulsion force. In this instance, the repulsion force is generated by the repeller 215 which is charged to be negative.

Also, the gas discharge device 212 injects a predetermined neutral gas into the arc chamber 210. The injected neutral gas is bombarded with the electrons, thereby generating ions.

When the generated ions exist in an extractable region 214, the ions are extracted from the arc chamber 210 to the extraction electrode 220 via the slit 213. Namely, since a voltage $V_e$ is supplied to the extraction electrode 220, an electric field is generated between the arc chamber 210 and the extraction electrode 220, and the ions may be extracted to the extraction electrode 220 via the slit 213 by the electric field.

In this instance, in the case of ions not existing in the extractable region 214, the ions are not extracted to the extraction electrode 220 and linger in the arc chamber 210. The ions residing in the arc chamber 210 may bombard the filament 211 and the repeller 215, thereby causing damage thereto. Also, as the residing ions are increased, an electric field distribution in the arc chamber 210 is temporally changed. Accordingly, a possibility that an arc occurs around the filament 211 and the repeller 215 is increased.

Also, in an ion supplying apparatus according to the conventional art, ions to be generated may not exist in the extractable region 214. Accordingly, only a small number of ions is extracted from the arc chamber 210 and a number of residing ions in the arc chamber 210 increases. Also, since it is highly possible that the above-described situation may repeatedly occur, an effectiveness of this ion implantation process is deteriorated.

Accordingly, an ion generator which can reduce lingering ions in the arc chamber 210 by effectively extracting ions from the arc chamber 210 to the extraction electrode 220 via the slit 213 is required.

SUMMARY OF THE INVENTION

Additional aspects, features and/or advantages of the invention will be set forth in part in the description which follows and, in part, will be apparent from the description, or may be learned by practice of the invention.

An aspect of the present invention provides an ion generator of an ion implanter which can reduce ions residing in an arc chamber and increase an amount of ions to be implanted, by installing a predetermined electrode in the arc camber opposite to the slit, generating an electric field towards the slit via the electrode, and thereby more effectively extracting ions from the arc chamber via the slit.

An aspect of the present invention also provides a magnetic field generator which can increase lingering time of electrons in an arc chamber by extending a motion trajectory of the electrons emitted from a filament via a screw motion, and also provides an ion generator of an ion implanter which can reduce a loss of electrons by temporally synchronizing current/voltage signals supplied to each electron, improving a possibility of generating ions and adjusting an amount of ions to be extracted. In this instance, the loss of electrons may occur when supplying the current/voltage signals.

An aspect of the present invention also provides an ion generator of an ion implanter which can increase durability of an arc chamber and each device installed therein, and also can improve system performance by more effectively extracting ions via a slit and thereby decreasing a number of ions lingering in the arc chamber.

According to an aspect of the present invention, there is provided an ion generator of an ion implanter, the ion generator including: an arc chamber provided with a slit for ion extraction and forming an equipotential surface with a first voltage; a filament installed inside of the arc chamber, heated to a predetermined temperature and generating electrons; magnetic field devices provided outside of the arc chamber and supplied with a current from a current source and generating a magnetic field in the arc chamber; a gas discharge device injecting a predetermined gas into the arc chamber; and an electrode positioned opposite to the slit and supplied with a second voltage having a larger value than the first voltage from a voltage source and generating an electric field in the arc chamber.

According to an aspect of the present invention, there is provided an ion generator including: an arc chamber provided with a slit for ion extraction; a filament, positioned inside of the arc chamber and generating electrons; magnetic field devices, positioned outside of the arc chamber, supplied with a current from a current source, and generating a magnetic field in the arc chamber for ion extraction; a gas discharge device injecting a predetermined gas into the arc chamber; and an electrode, positioned opposite to the slit, wherein voltages supplied to the electrode and slit are used to generate an electric field in the arc chamber for ion extraction According to an aspect of the present invention, there is provided a method for generating ions for an ion implanter, including: injecting a gas into an arc chamber; generating an electric field between a slit for ion extraction and an electrode in the arc chamber by applying different voltages to the slit and the electrode; generating a magnetic field in the arc by applying a current to a first magnetic field device and a second magnetic field device, wherein the first magnetic field device and the second magnetic field device are positioned outside of the arc chamber and on opposite sides of the arc chamber.

BRIEF DESCRIPTION OF THE DRAWINGS

These and/or other aspects, features, and advantages of the invention will become apparent and more readily appreciated from the following description of exemplary embodiments, taken in conjunction with the accompanying drawings of which.

DETAILED DESCRIPTION OF THE PREFERRED EMBODIMENTS

Figure 1:
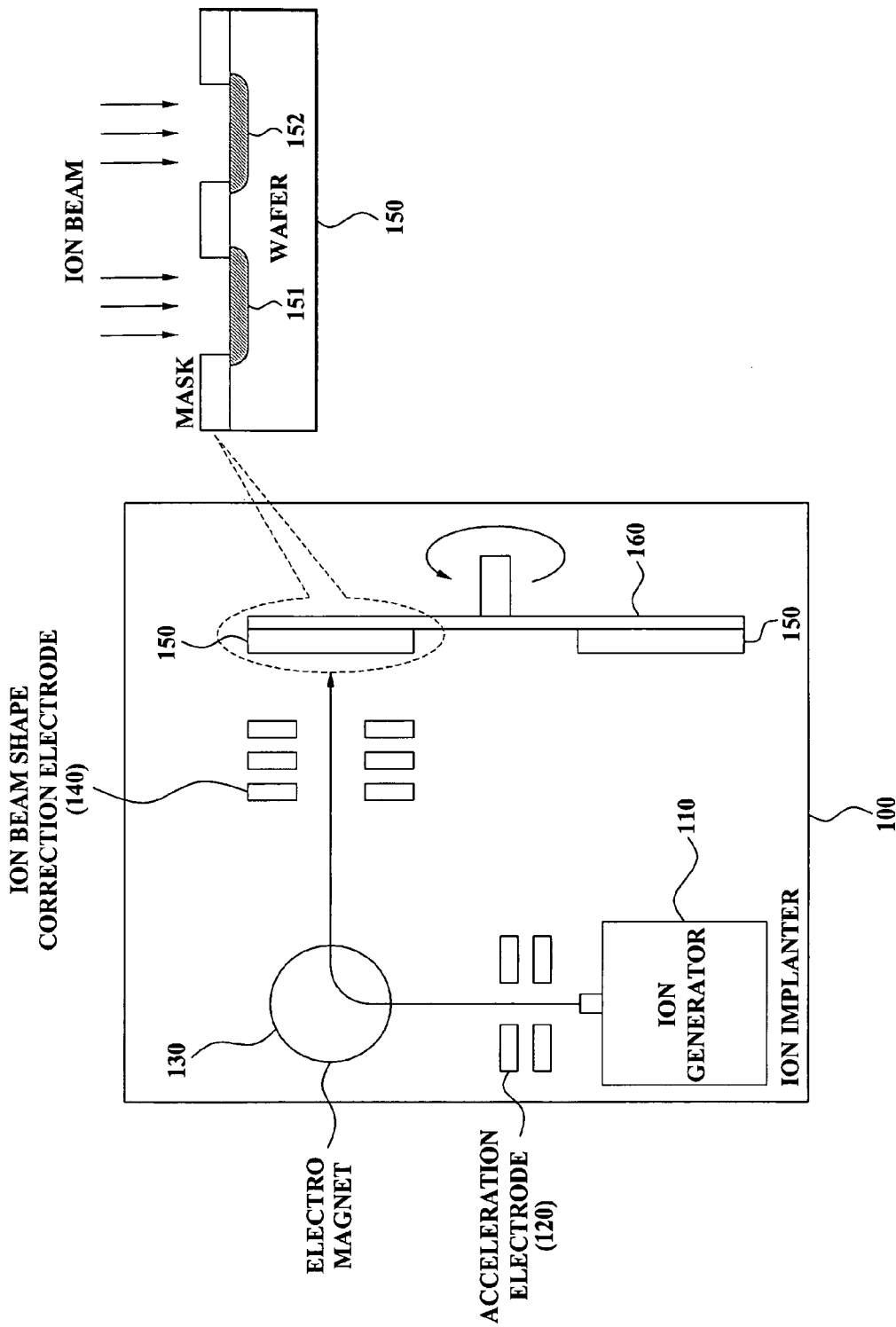
FIG. 1 is a diagram illustrating a configuration of an ion implanter according to a conventional art.
Figure 2:
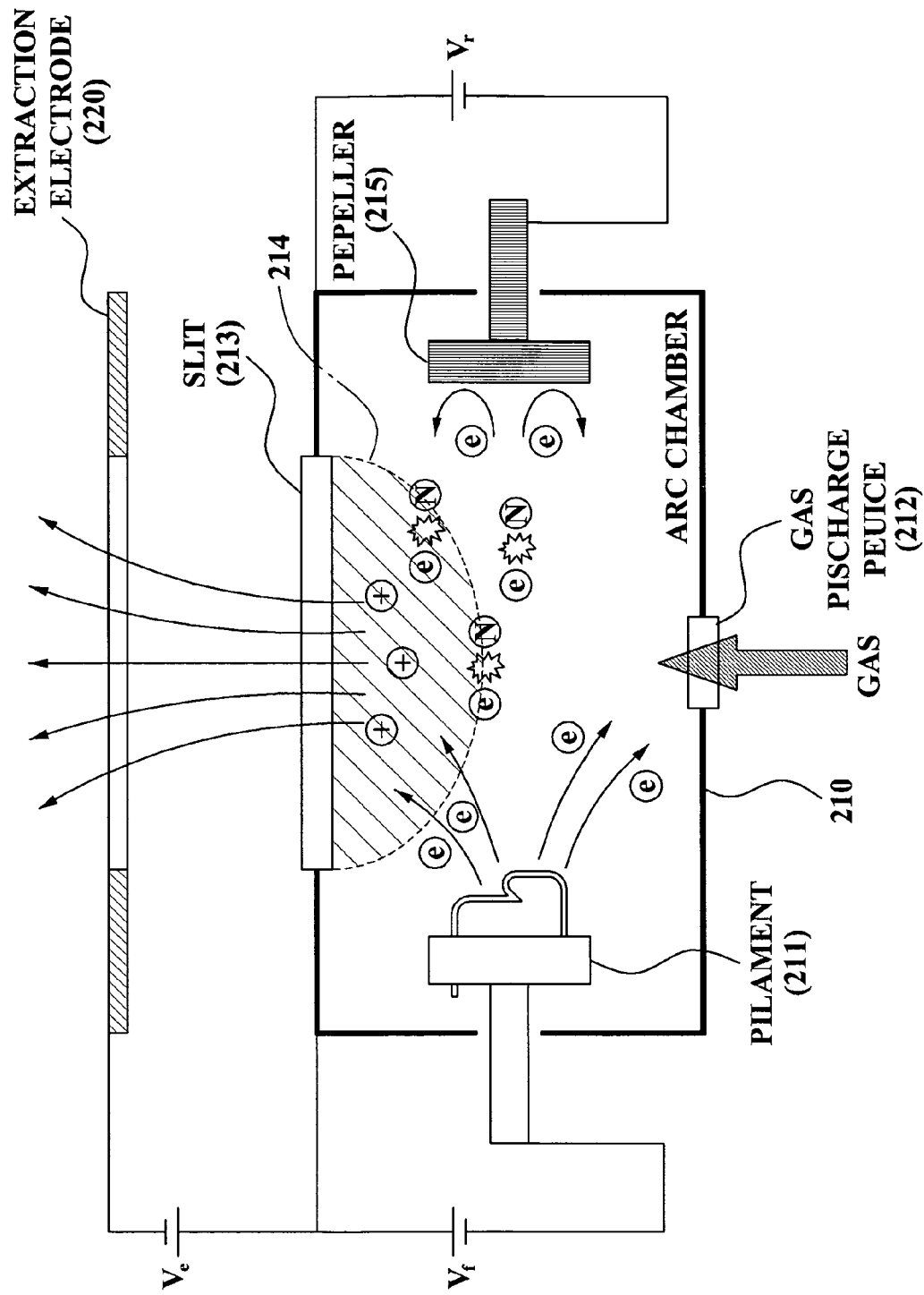
FIG. 2 is a diagram illustrating a configuration of an ion generator of an ion implanter according to a conventional art.

Reference will now be made in detail to exemplary embodiments of the present invention, examples of which are illustrated in the accompanying drawings, wherein like reference numerals refer to the like elements throughout. Exemplary embodiments are described below in order to explain the present invention by referring to the figures.

Figure 3:
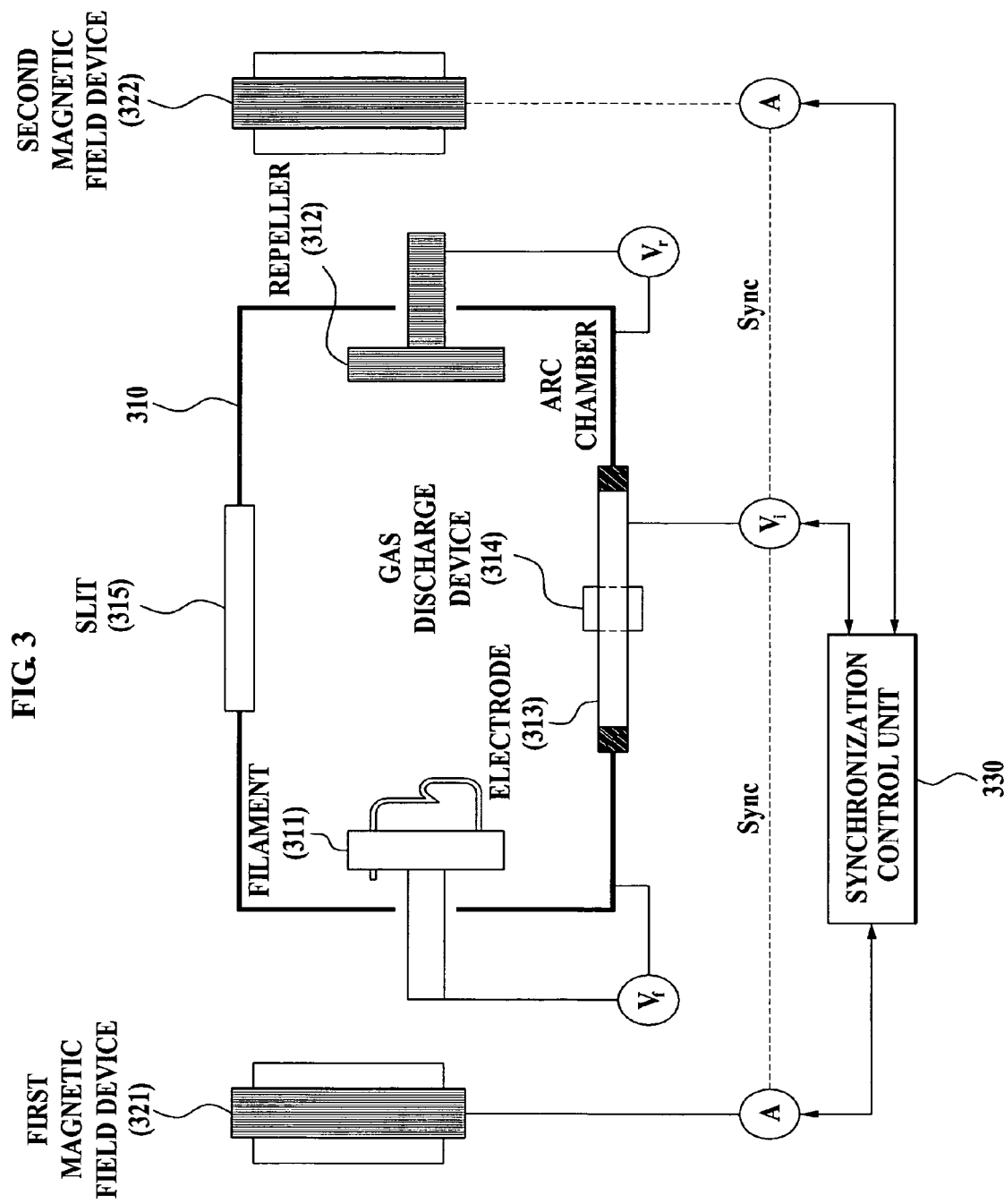
FIG. 3 is a diagram illustrating a configuration of an ion generator according to an exemplary embodiment of the present invention.

FIG. 3 is a diagram illustrating a configuration of an ion generator according to an exemplary embodiment of the present invention.

An ion generator according to an exemplary embodiment includes an arc chamber 310, a filament 311, a repeller 312, an electrode 313, a gas discharge device 314, a slit 315, a first magnetic field device 321, a second magnetic field device 322 and a synchronization control unit 330, which will be described later.

The arc chamber 310 may be in a shape of a box, which can be utilized in an ion implantation process. The arc chamber 310 may indicate any type of arc chamber. However, in an exemplary embodiment, as an example and for the convenience of this description, the arc chamber 310 is in the shape of a box. However, the arc chamber 310 may have different shapes. Also, the arc chamber 310 may be supplied with a voltage $V_f$ and form an equipotential surface with a first voltage.

The slit 315 may be installed on a first surface of the arc chamber 310. As illustrated in FIG. 3, the slit 315 may be provided on the first surface which is a top surface of the arc chamber 310. In this instance, ions existing in the arc chamber 310 may be extracted via the slit 315, which will be described later.

The filament 311 may be installed inside of the arc chamber 310 so as to correspond to a second surface thereof which is perpendicular to the first surface. In this instance, the filament 311 is heated to a predetermined temperature and generates electrons. The generated electrons are emitted towards the inside of the arc chamber 310.

The first and second magnetic field devices 321 and 322 may be installed (positioned) outside of the arc chamber 310 so as to correspond to the second surface and a third surface facing the second surface. When a predetermined current is supplied, a magnetic field is generated in the arc chamber 310.

Namely, the first magnetic field device 321 may be provided outside of the arc chamber 310 to correspond to the second surface, for example, a left side of the arc chamber 310 as illustrated in FIG. 3. Also, the second magnetic field device 322 may be provided outside of the arc chamber 310 to correspond to the third surface, for example, a right side of the arc camber 310 as illustrated in FIG. 3.

When a current is supplied to the first magnetic field device 321 and the second magnetic field device 322 from a current source A, the first magnetic field device 321 and the second magnetic field device 322 generate a magnetic field in the arc chamber 310. In this instance, the first magnetic field device 321 functions as an N pole and the second magnetic field device 322 functions as an S pole. The magnetic field flows from the first magnetic field device 321 towards the second magnetic field device 322. A case opposite thereto is also possible. Namely, the first magnetic field device 321 may function as an S pole and the second magnetic field device 322 may function as an N pole.

The magnetic field may increase the lingering time of electrons in the arc chamber 310 by extending a motion trajectory of electrons emitted from the filament 311, described with reference to FIG. 4 below.

Figure 4:
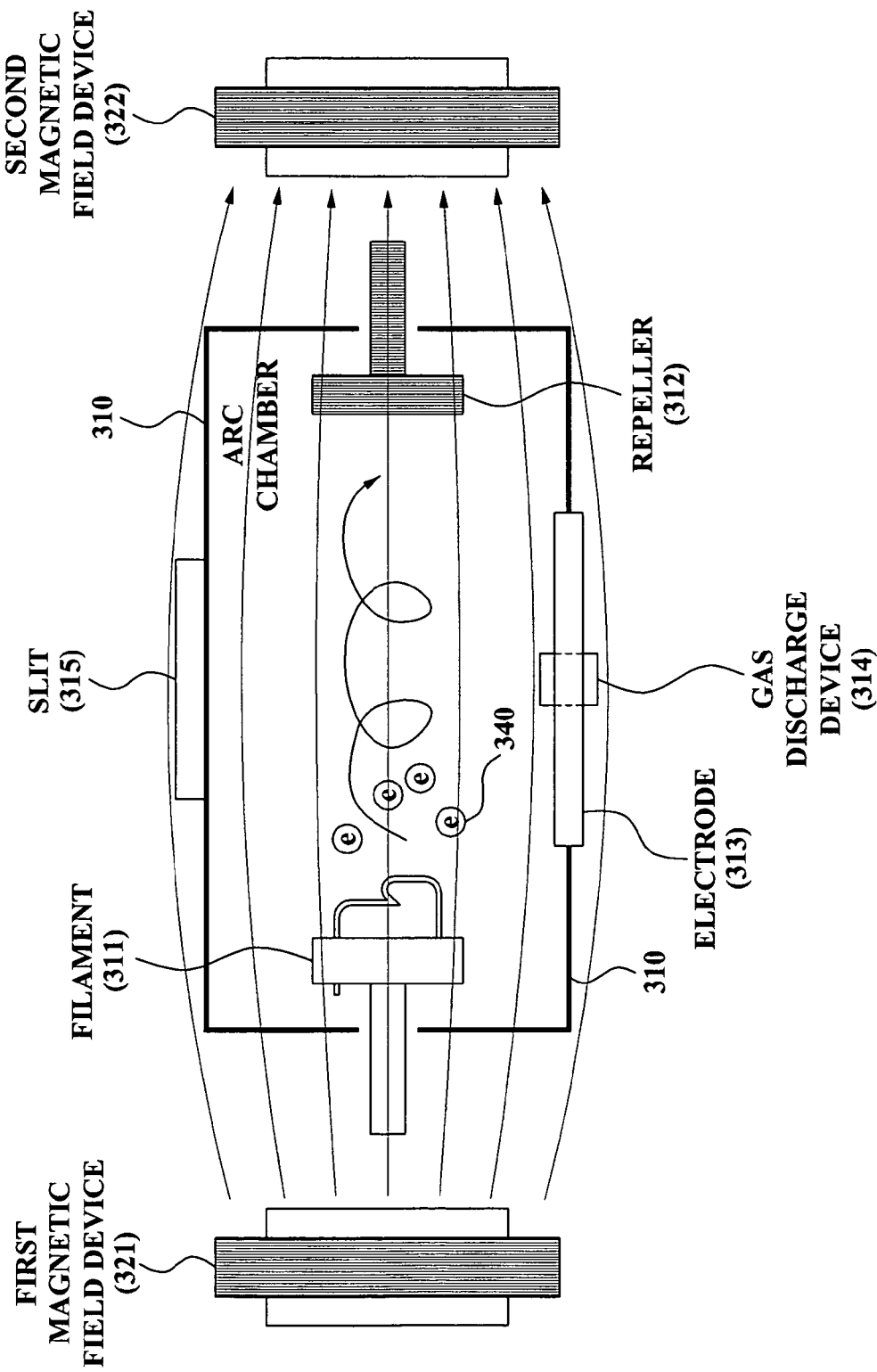
FIG. 4 is a diagram illustrating a motion trajectory of electrons by a magnetic field generated according to an exemplary embodiment of the present invention.

FIG. 4 is a diagram illustrating the motion trajectory of electrons by a magnetic field generated according to an exemplary embodiment of the present invention.

As described above, a magnetic field is generated by magnetic field devices 321 and 322, and the generated magnetic field may control the motion trajectory of electrons 340 to be prolonged. Namely, as illustrated in FIG. 4, electrons emitted from a filament 311 perform a type of screw motion due to the magnetic field. When the electrons 340 linger in an arc chamber 310 performing a screw motion, a length of the motion trajectory of the electrons is extended. Accordingly, the lingering time of the electrons 340 is also increased.

Accordingly, referring to FIGS. 3 and 4, as electrons linger longer in the arc chamber 310, it may be increasingly possible that the electrons bombard a gas discharged from the gas discharge device 314 and thereby generate ions.

Also, the gas discharge device 314 is provided on a fourth surface of the arc chamber 310 facing the first surface, and injects a predetermined gas into the arc chamber 310. In this instance, the electrons emitted from the filament 311 bombard the injected gas and generate ions.

The gas injected into the arc chamber 314 via the gas discharge device 314 may include any one of a positive-doped boron and a negative-doped arsenic.

The repeller 312 is provided inside of the arc chamber 310, corresponding to the third surface. Also, the repeller 312 may be embodied to have a lower electric potential than the arc chamber 310. In this instance, the third surface may be designed to be perpendicular to the first surface and face the second surface. Namely, as illustrated in FIG. 3, the repeller 312 may be provided on the right side of the arc chamber 310. When a voltage $V_r$ is supplied, the repeller 312 may be charged to be negative. In this case, electrons emitted from the filament 311 and accelerated to the repeller 312 may be re-accelerated towards the filament 311 because of a repulsion force with the repeller 312. Accordingly, the lingering time of the electrons in the arc chamber 310 is increased.

The electrode 313 is provided on the fourth surface, supplied with a second voltage and generates an electric field in the arc chamber 310. Namely, when a voltage $V_i$ is supplied to the electrode 313, an electric field is generated between the electrode 313 and the first surface of the arc chamber 310 provided with the slit 315. In this instance, the second voltage, the voltage $V_i$, supplied to the electrode 313 may be higher than the first voltage supplied to the arc chamber 310. Accordingly, an electric field is generated between the electrode 313 and the slit 315 by a voltage difference between the first voltage and the second voltage.

The electric field enables ions existing in the arc chamber 310 to be effectively extracted therefrom via the slit 315, described in detail with reference to FIG. 5 below.

Figure 5:
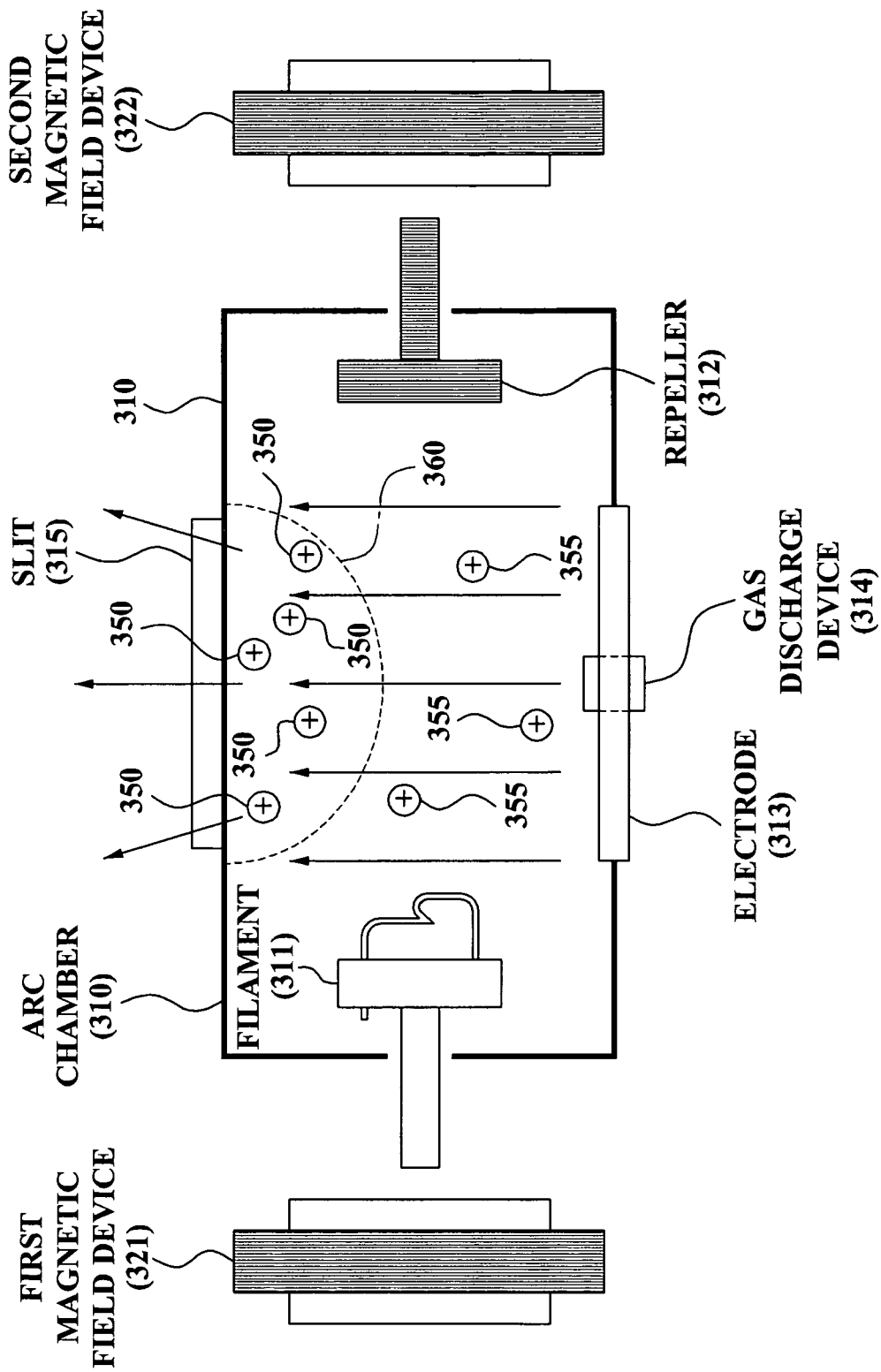
FIG. 5 is a diagram illustration motion of ions in an arc chamber in which a magnetic field is generated according to an exemplary embodiment of the present invention.

FIG. 5 is a diagram illustrating motion of ions in an arc chamber in which a magnetic field is generated according to an exemplary embodiment of the present invention.

As described above, an electric field is generated towards a slit 315 by an electrode 313. In this instance, since the electric field is generated from the anode direction towards the cathode direction, positive ions existing in the electric field move towards the direction of the electric field, that is, towards the slit 315 in FIG. 5. Namely, as the positive ions move towards the slit 315, more positive ions may be positioned in an extractable region 360. Accordingly, more positive ions may be extracted to the outside via the slit 315.

When ions 350 are positioned in the extractable area 360 formed around the slit 315, the ions may be extracted to the outside via the slit 315. As illustrated in FIG. 5, ions 350 positioned in the extractable region 360 may be extracted to the outside via the slit 315. However, another ions 355 not positioned in the extractable region 360 may not be extracted to the outside and just linger in the arc chamber 310, which may shorten a durability of each device installed in the arc chamber 310. However, as in the present exemplary embodiment, when installing the electrode 313 on the arc chamber 310 and generating an electric field towards the slit 315, the ions 355 not positioned in the extractable region 360 may be affected by a force from the electric field and thereby move towards the extractable region 360. Accordingly, it is possible to reduce a number of ions lingering in the arc chamber 310 and also increase a number of ions extracted to the outside via the slit 315.

Referring again to FIG. 3, the synchronization control unit 330 controls the current source A and the voltage source $V_i$ so that a current and a voltage supplied to the magnetic field devices 321 and 322 and the electrode 313 are temporally synchronized, as described in detail with reference to FIG. 6 below.

Figure 6:
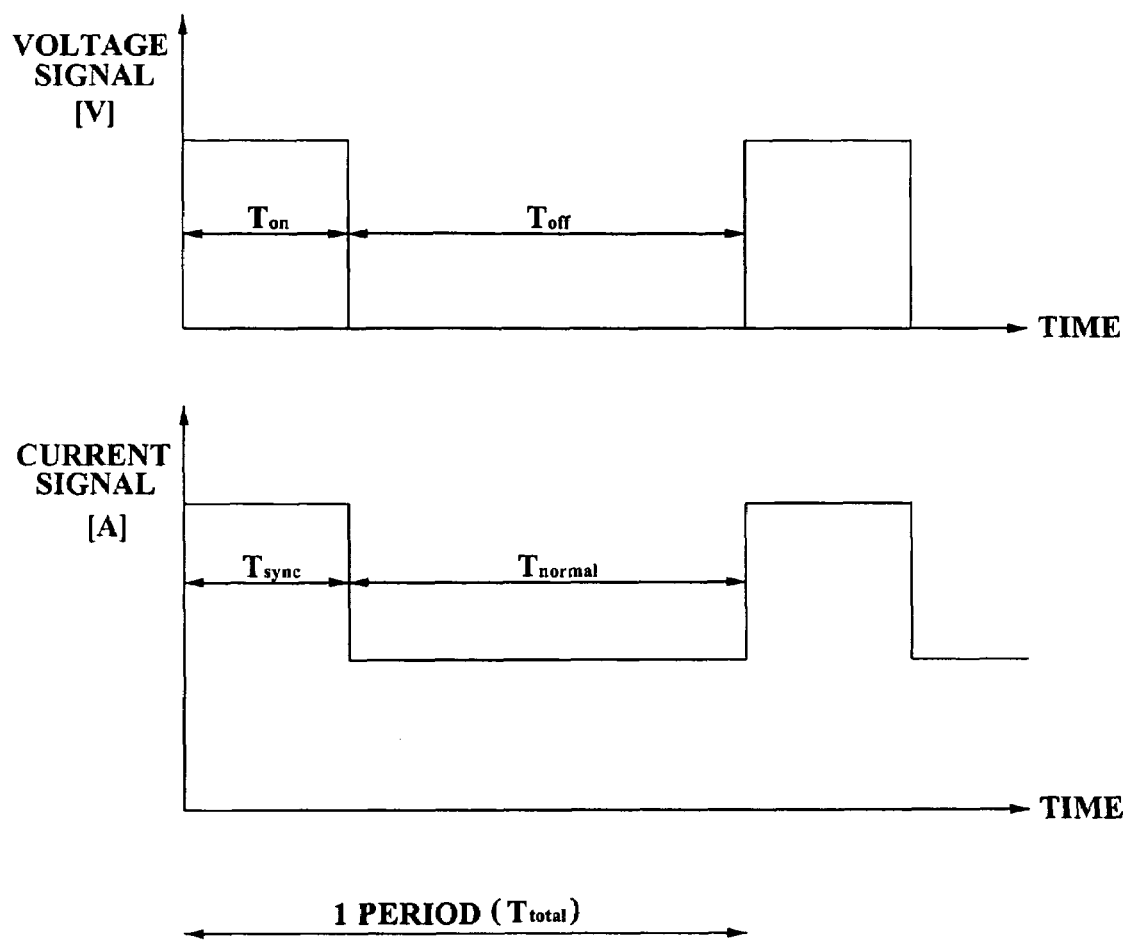
FIG. 6 is a diagram illustrating an example of an output signal waveform of a current source A and a voltage source $V_i$ according to an exemplary embodiment of the present invention.

FIG. 6 is a diagram illustrating an example of an output signal waveform of a voltage source V and a current source A according to an exemplary embodiment of the present invention.

The synchronization control unit 330 may control an output of the current source A and the voltage source $V_i$ so that any one of a step pulse, a sinusoidal pulse and a saw pulse can be supplied to each of the electrode 313 and the magnetic field devices 321 and 322. In this instance, in addition to the above-described waveforms, the output signal may include any type of waveform which is utilized in the art. As described above, outputs supplied to the electrode 313 and the magnetic field devices 321 and 322 may be embodied into a waveform having a predetermined period. In FIG. 6, as an example, the output signals are embodied using a step pulse.

As illustrated in FIG. 6, the synchronization control unit 330 may supply a voltage to the electrode 313 for a $T_{on}$ time, and may not supply the voltage signal for a $T_{off}$ time after the $T_{on}$ time elapses. Also, the synchronization control unit 330 supplies a current to the magnetic field devices 321 and 322 for a $T_{sync}$ time in which the current signal is larger than a current supplied for a $T_{normal}$ time. Also, the synchronization control unit 330 supplies a constant current to the magnetic field devices 321 and 322 for the $T_{normal}$ in which the current is smaller than the current signal supplied for the $T_{sync}$.

In this instance, the synchronization control unit 330 may temporally synchronize each output signal supplied to the electrode 313 and the magnetic field devices 321 and 322. Namely, the synchronization control unit 330 may control output signals of the current source A and the voltage source $V_i$ so that the $T_{on}$ and the $T_{sync}$ are identical to each other.

Accordingly, the temporally synchronized output signals may be supplied to the electrode 313 and the magnetic field devices 321 and 322. Namely, the electric field of the electrode 313 and the magnetic field of the magnetic field devices 321 and 322 may be simultaneously turned on/off. As described above, when the on/off of the electric field and the magnetic field are temporally synchronized, a loss of electrodes caused by the output signals may be reduced.

Also, the step pulse may be set to have a $T_{total}$ period. In this case, the synchronization control unit 330 may variously set the $T_{total}$ period according to a user's selection, thereby controlling a current signal to be supplied. Also, the synchronization control unit 330 may variously set $T_{on}/T_{total}$ which is a time ratio of supplying the voltage/current signal.

As described above, it is possible to control an amount of ions extracted to the outside via the slit 315 by controlling a supply period of the voltage/current signal.

Namely, an ion generator of an ion implanter according to the present invention generates an electric field and thereby enables ions in an arc chamber to be more effectively extracted to the outside. Also, the ion generator of the ion implanter may reduce a loss of electrons which may occur when supplying output signals, and may also increase an extraction rate of ions to be extracted to the outside by temporally synchronizing current and voltage signals supplied to an electric field device and magnetic field devices.

FIG. 7 is a diagram illustrating the behavior of ions in an arc chamber, when an electric field and a magnetic field are generated in the arc chamber via an ion generator according to an exemplary embodiment of the present invention.

Figure 7A:
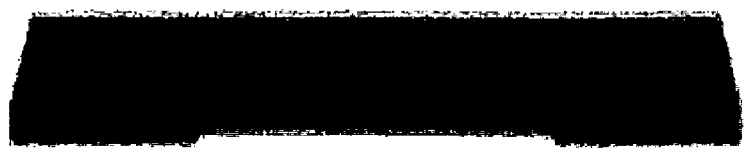
FIGS. 7A and 7B are diagrams illustrating the behavior of ions in an arc chamber, when an electric field and/or a magnetic field are generated in the arc chamber via an ion generator according to an exemplary embodiment of the present invention.
Figure 7A:

As illustrated in FIG. 7(a), when applying only a magnetic field in an arc chamber and not applying an electric field therein, for example, $V_i=0V$, B=100 G, ions are generally positioned in a lower portion of the arc chamber. Accordingly, since the ions are not positioned in an extractable region of the arc chamber, a small amount of ions is extracted and a greater number of ions lingers in the arc chamber. Accordingly, durability of each device installed in the arc chamber may be shortened.

Figure 7B:
Figure 7B:

However, as illustrated in FIG. 7(b), when applying an appropriate amount of voltage to an electrode and generating an electric field towards a slit in an arc chamber, for example, $V_i=300V$, B=200 G, ions are generally positioned in an extractable region of the arc chamber. Accordingly, since an extraction rate of the ions increases, a number of residing ions may be reduced. Also, since the ions do not have a large mass, the ions are not significantly affected by the magnetic field. The ions may be continuously positioned in the extractable region by the electric field. The strength of the electric field and the strength of the magnetic field may be variously set according to circumstances.

According to the above-described exemplary embodiments of the present invention, an ion generator of an ion implanter can reduce ions lingering in an arc chamber and increase an amount of ions to be implanted, by installing a predetermined electrode in the arc chamber facing the slit, generating an electric field towards the slit via the electrode, and thereby more effectively extracting ions from the arc chamber via the slit.

Also, according to the above-described exemplary embodiments of the present invention, a magnetic field generator can increase a lingering time of electrons in an arc chamber by extending a motion trajectory of the electrons emitted from a filament via a screw motion. Also, an ion generator of an ion implanter can reduce a loss of electrons by temporally synchronizing current/voltage signals supplied to each electrode, improving a possibility of generating ions and controlling an amount of ions to be extracted. In this instance, the loss of electrons may occur when supplying the current/voltage signals.

Also, according to the above-described embodiments of the present invention, an ion generator of an ion implanter can increase durability of an arc chamber and each device installed therein, and also can improve system performance by more effectively extracting ions via a slit and thereby decreasing a number of ions lingering in the arc chamber.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. An ion generator of an ion implanter, the ion generator comprising:
    an arc chamber provided with a slit for ion extraction and forming an equipotential surface with a first voltage, wherein the arc chamber has first, second, third, and fourth surfaces, the second and third surfaces are perpendicular to the first and fourth surfaces, and the slit is provided through the first surface of the arc chamber;
    a filament, installed inside of the arc chamber, heated to a predetermined temperature, and generating electrons, wherein the filament is installed inside of the arc chamber to correspond to a second surface, which is perpendicular to the first surface;
    first and second magnetic field devices, positioned outside of the arc chamber, supplied with a current from a current source, and generating a magnetic field in the arc chamber for ion extraction, wherein the first magnetic field device is positioned outside of the arc chamber in a position corresponding to the second surface and the second magnetic field device is positioned outside of the arc chamber in a position corresponding to the third surface;
    a gas discharge device injecting a predetermined gas into the arc chamber;
    an electrode, positioned opposite to the slit, supplied with a second voltage from a voltage source, and generating an electric field in the arc chamber, wherein the second voltage has a higher voltage than the first voltage, wherein the electrode is provided on the fourth surface; and
    a synchronization control unit temporally synchronizing output signals of the current source to supply current to the first and second magnetic field devices and output signals of the voltage source to supply second voltage to the electrode for ion extraction.

2. The ion generator of claim 1, wherein each output signal is any one of a step pulse, a sinusoidal wave, and a sawtooth wave.

3. The ion generator of claim 1, further comprising:
    a repeller provided inside of the arc chamber and charged to a voltage lower than the first voltage.

4. The ion generator of claim 1, wherein the gas includes any one of positive-doped boron and negative-doped arsenic.

5. The ion generator of claim 1, wherein the synchronization unit adjusts an amount of ions to be extracted.

6. An ion generator comprising:
    an arc chamber provided with a slit for ion extraction, wherein the arc chamber has first, second, third, and fourth surfaces, the second and third surfaces are perpendicular to the first and fourth surfaces, and the slit is provided through the first surface of the arc chamber;
    a filament positioned inside of the arc chamber and generating electrons;
    first and second magnetic field devices, positioned outside of the arc chamber, supplied with a current from a current source, and generating a magnetic field in the arc chamber for ion extraction, wherein the first magnetic field device is positioned outside of the arc chamber in a position corresponding to the second surface and the second magnetic field device is positioned outside of the arc chamber in a position corresponding to the third surface;
    a gas discharge device injecting a predetermined gas into the arc chamber;
    an electrode, positioned opposite to the slit,
    wherein voltages supplied to the electrode and slit are used to generate an electric field in the arc chamber for ion extraction; and
    a synchronization control unit temporally synchronizing output signals of the current source to supply current to the first and second magnetic field devices and output signals of the voltage source to supply voltage to the electrode for ion extraction.

7. The ion generator of claim 6, wherein each output signal is any one of a step pulse, a sinusoidal wave, and a sawtooth wave.

8. The ion generator of claim 6, further comprising: a repeller provided inside of the arc chamber and charged to a voltage lower than voltage about the slit.

9. The ion generator of claim 6, wherein the gas includes any one of positive-doped boron and negative-doped arsenic.

* * * * *